US011276467B2

United States Patent
Liu et al.

(10) Patent No.: US 11,276,467 B2
(45) Date of Patent: Mar. 15, 2022

(54) METHOD OF PROGRAMMING MEMORY DEVICE AND RELATED MEMORY DEVICE HAVING A CHANNEL-STACKED STRUCTURE

(71) Applicant: Yangtze Memory Technologies Co., Ltd., Wuhan (CN)

(72) Inventors: Hongtao Liu, Wuhan (CN); Lei Jin, Wuhan (CN); Shan Li, Wuhan (CN); Yali Song, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/836,885

(22) Filed: Mar. 31, 2020

(65) Prior Publication Data

US 2021/0264981 A1 Aug. 26, 2021

Related U.S. Application Data

(63) Continuation of application No. PCT/CN2020/076688, filed on Feb. 26, 2020.

(51) Int. Cl.

| G11C 16/10 | (2006.01) |
|---|---|
| G11C 16/04 | (2006.01) |
| G11C 16/08 | (2006.01) |
| G11C 16/24 | (2006.01) |
| G11C 16/28 | (2006.01) |
| G11C 16/30 | (2006.01) |
| G11C 16/32 | (2006.01) |
| G11C 16/34 | (2006.01) |

(52) U.S. Cl.
CPC .......... *G11C 16/10* (2013.01); *G11C 16/0441* (2013.01); *G11C 16/08* (2013.01); *G11C 16/24* (2013.01); *G11C 16/28* (2013.01); *G11C 16/30* (2013.01); *G11C 16/32* (2013.01); *G11C 16/3431* (2013.01)

(58) Field of Classification Search
CPC . G11C 16/0483; G11C 16/10; G11C 16/3431; G11C 16/08; G11C 16/32; G11C 16/30; G11C 16/24; G11C 16/0441; G11C 16/28
See application file for complete search history.

(56) References Cited

U.S. PATENT DOCUMENTS

| 7,859,902 B2 | 12/2010 | Maejima |
|---|---|---|
| 8,724,399 B2 | 5/2014 | Winstead |

(Continued)

FOREIGN PATENT DOCUMENTS

| CN | 101595529 A | 12/2009 |
|---|---|---|
| CN | 101627440 A | 1/2010 |

(Continued)

*Primary Examiner* — Mushfique Siddique
(74) *Attorney, Agent, or Firm* — Winston Hsu (57) ABSTRACT

A vertical NAND string in a channel-stacked 3D memory device may be programmed using ISPP scheme, wherein a preparation step is introduced immediately after each verification step and before the start of a corresponding verification step. During the preparation step, the electrons accumulated in the channel may be drained by the selected bit line for enhancing the coupling effect of the channel, thereby reducing program disturb and increasing program speed.

10 Claims, 9 Drawing Sheets

(56) References Cited

U.S. PATENT DOCUMENTS

| | | | |
|---|---|---|---|
| 8,929,145 B2 | 1/2015 | Lee | |
| 8,934,303 B2 | 1/2015 | Park | |
| 9,099,202 B2 | 8/2015 | Mihnea | |
| 9,640,273 B1* | 5/2017 | Chen | G11C 16/10 |
| 10,115,464 B1* | 10/2018 | Lu | G11C 11/5642 |
| 10,153,045 B2 | 12/2018 | Kimura | |
| 10,153,051 B1* | 12/2018 | Chen | G11C 11/5628 |
| 10,269,435 B1* | 4/2019 | Chen | G11C 16/26 |
| 10,629,272 B1* | 4/2020 | Lu | G11C 16/0483 |
| 10,665,299 B1* | 5/2020 | Lu | G11C 16/3459 |
| 10,665,306 B1* | 5/2020 | Chen | G11C 11/5642 |
| 10,790,003 B1* | 9/2020 | Chen | G11C 11/2297 |
| 2015/0294726 A1 | 10/2015 | Sim | |
| 2016/0099066 A1* | 4/2016 | Dunga | G11C 16/24 |
| | | | 365/185.17 |
| 2017/0278579 A1 | 9/2017 | Lee | |
| 2019/0147959 A1 | 5/2019 | Hsu | |
| 2019/0206481 A1 | 7/2019 | Yamada | |
| 2019/0378579 A1* | 12/2019 | Zhao | G11C 16/12 |
| 2020/0168276 A1* | 5/2020 | Yang | G11C 16/045 |

FOREIGN PATENT DOCUMENTS

| | | |
|---|---|---|
| CN | 102725797 A | 10/2012 |
| CN | 106486165 A | 3/2017 |
| CN | 110400590 A | 11/2019 |
| CN | 110770836 A | 2/2020 |
| TW | I604454 B | 11/2017 |

* cited by examiner

METHOD OF PROGRAMMING MEMORY DEVICE AND RELATED MEMORY DEVICE HAVING A CHANNEL-STACKED STRUCTURE

CROSS REFERENCE TO RELATED APPLICATIONS

This application is a continuation of PCT Application No. PCT/CN2020/076688 filed on 2020 Feb. 26, the entire contents of which are incorporated herein by reference.

BACKGROUND OF THE INVENTION

1. Field of the Invention

The present invention is related a method of programming a memory device and related memory device, and more particularly, to a method of reducing program disturb and increasing program speed when programming a memory device and related memory device.

2. Description of the Prior Art

Semiconductor memory has become more popular for use in various electronic devices. For example, non-volatile semiconductor memory is applied in cellular telephones, digital cameras, personal digital assistants, mobile computing devices, non-mobile computing devices and other devices. Recently, ultra high density storage devices have been proposed using a three-dimensional (3D) stacked memory structure sometimes referred to as a Bit Cost Scalable (BiCS) architecture. For example, a 3D NAND flash memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers.

A single-level cell (SLC) non-volatile memory can only store only one bit per memory element, while a multi-level cell (MLC) non-volatile memory can store more than one bit per cell. For example, a NAND memory having 16 voltage levels per cell may be referred to as quad-level cell (QLC) memory and may represent 4 bits of data per cell.

In a prior art method of programming a 3D memory device, the storage layers are programed in a direction from bottom to top. The electrons accumulated in the channel may prevent the selected word line from being pre-charged to an appropriate level, thereby causing program disturbs and decreasing program speed.

SUMMARY OF THE INVENTION

The present invention provides a method of programming a memory device which includes a plurality of memory cells, a plurality of word lines, a plurality of bit lines, a plurality of top select gates and a bottom select gate. The method includes performing a first program step on the plurality of memory cells, performing a first verify step on the plurality of memory cells after performing the first program step, performing a preparation step on the plurality of memory cells after performing the first verify step, and performing a second program step on one or multiple memory cells among the plurality of memory cells which fail the first verify step after performing the preparation step. The preparation step includes deactivating the bottom select gate, ramping a selected bit line and an unselected bit line among the plurality of bit lines to a pre-charge voltage, deactivating a selected word line and an unselected word line among the plurality of word lines at a first time point during the preparation step, and deactivating a selected top select gate and an unselected top select gate among the plurality of top select gates at a second time point during the preparation step, wherein the second time point occurs later than the first time point.

The present invention also provides a method of programming a memory device which includes a first channel associated with a bottom select gate, a selected bit line and a first group of word lines, a second channel stacked on the first channel and associated with a selected top select gate, the selected bit line and a second group of word lines, and a middle dummy layer disposed between the first channel and the second channel. The method includes performing a first program step on the first channel and the second channel, performing a first verify step on the first channel and the second channel after performing the first program step, performing a preparation step on the first channel and the second channel after performing the first verify step, and performing a second program step on one or multiple memory cells in the first channel or the second channel which fail the first verify step after performing the preparation step. The preparation step includes deactivating the bottom select gate, ramping a selected bit line and an unselected bit line among the plurality of bit lines to a pre-charge voltage, deactivating the middle dummy layer and an unselected word line in the first group of word lines at a first time point during the preparation step, deactivating a unselected word line in the second group of word lines at a second time point during the preparation step, wherein the second time occurs later than the first time point, deactivating a selected word line in the first group of word lines or in the second group of word lines at the second time point, and deactivating the selected top select gate at a third time point during the preparation step, wherein the third time occurs later than the second time point.

The present invention also provides a memory device which includes a plurality of memory cells, a plurality of word lines, a plurality of bit lines, a plurality of top select gates, a bottom select gate and a control unit. The control unit is configured to perform a first program step on the plurality of memory cells, perform a first verify step on the plurality of memory cells after performing the first program step, perform a preparation step on the plurality of memory cells after performing the first verify step, and perform a second program step on one or multiple memory cells among the plurality of memory cells which fail the first verify step after performing the preparation step. The preparation step includes deactivating the bottom select gate, ramping a selected bit line and an unselected bit line among the plurality of bit lines to a pre-charge voltage, deactivating a selected word line and an unselected word line among the plurality of word lines at a first time point during the preparation step, and deactivating a selected top select gate and an unselected top select gate among the plurality of top select gates at a second time point during the preparation step, wherein the second time point occurs later than the first time point.

The present invention also provides a memory device which includes a first channel associated with a bottom select gate, a selected bit line and a first group of word lines, a second channel stacked on the first channel and associated with a selected top select gate, the selected bit line and a second group of word lines, a middle dummy layer disposed between the first channel and the second channel, and a control unit. The control unit is configured to perform a first program step on the first channel and the second channel, perform a first verify step on the first channel and the second channel after performing the first program step, perform a preparation step on the first channel and the second channel after performing the first verify step, and perform a second program step on one or multiple memory cells in the first channel or the second channel which fail the first verify step after performing the preparation step. The preparation step includes deactivating the bottom select gate, ramping a selected bit line and an unselected bit line among the plurality of bit lines to a pre-charge voltage, deactivating the middle dummy layer and an unselected word line in the first group of word lines at a first time point during the preparation step, deactivating a unselected word line in the second group of word lines at a second time point during the preparation step, wherein the second time occurs later than the first time point, deactivating a selected word line in the first group of word lines or in the second group of word lines at the second time point, and deactivating the selected top select gate at a third time point during the preparation step, wherein the third time occurs later than the second time point.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
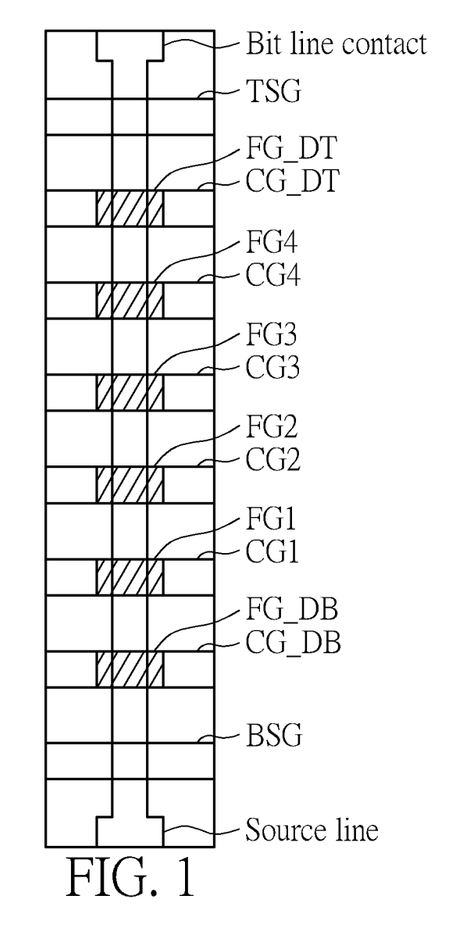
FIG. 1 is a top-view diagram illustrating one planar NAND string associated with a channel-stacked 3D memory device according to an embodiment of the present invention.
Figure 2:
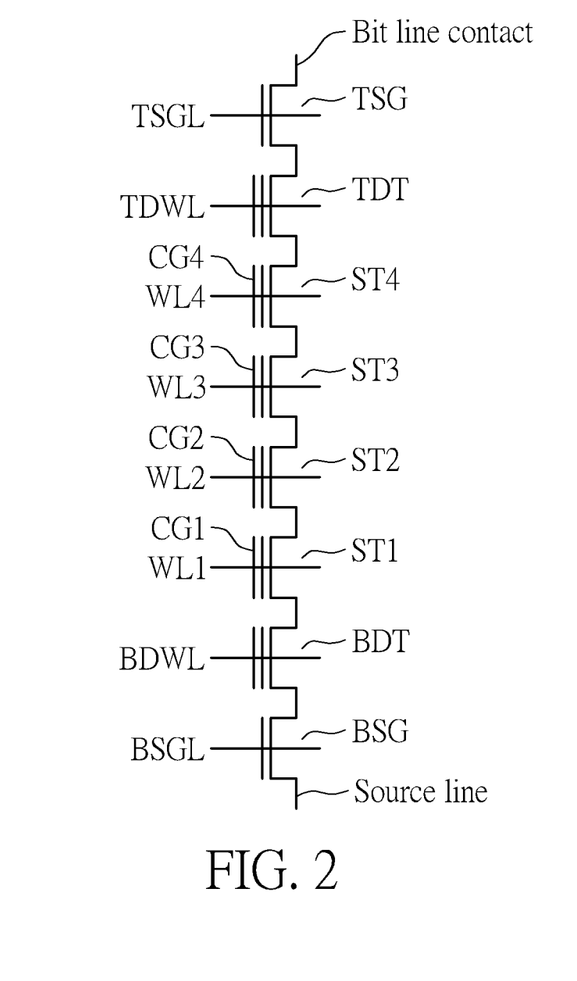
FIG. 2 is a diagram illustrating an equivalent circuit of one planar NAND string associated with a channel-stacked 3D memory device according to an embodiment of the present invention.

FIG. 1 is a top-view diagram illustrating one planar NAND string associated with a channel-stacked 3D memory device according to an embodiment of the present invention. FIG. 2 is a diagram illustrating an equivalent circuit thereof. In a flash memory system using the NAND structure, multiple transistors are arranged in series and sandwiched between two select gates, which are referred to as a NAND string. The planar NAND string depicted in FIGS. 1 and 2 includes a top dummy transistor TDT, four storage transistors ST1~ST4 and a bottom dummy transistor BDT coupled in series and sandwiched between a top select gate TSG (on the drain side) and a bottom select gate SG B (on the source side). The top select gate TSG is arranged for connecting the planar NAND string to a bit line via a bit line contact and may be controlled by applying appropriate voltages to a top select gate line SGTL. The bottom select gate BSG is arranged for connecting the planar NAND string to a source line and may be controlled by applying appropriate voltages to a bottom select gate line BSGL. Each of the top dummy transistor TDT, the bottom dummy transistor BDT and the storage transistors ST1-ST4 includes a control gate and a floating gate. For example, the storage transistor ST1 includes a control gate CG1 and a floating gate FG1, the storage transistor ST2 includes a control gate CG2 and a floating gate FG2, the storage transistor ST3 includes a control gate CG3 and a floating gate FG3, the storage transistor ST4 includes a control gate CG4 and a floating gate FG4, the top dummy transistor TDT includes a control gate CG_DT and a floating gate FG_DT, and the bottom dummy transistor BDT includes a control gate CG_DB and a floating gate FG_DB. The control gate CG1 is connected to a word line WL1, the control gate CG2 is connected to a word line WL2, the control gate CG3 is connected to a word line WL3, the control gate CG4 is connected to a word line WL4, the control gate CG_DT is connected to a top dummy word line TDWL, and the control gate CG_DB is connected to a bottom dummy word line BDWL.

For illustrative purpose, FIGS. 1 and 2 show four memory cells for read/write operation (the storage transistors ST1-ST4) and two dummy cells for read/write test (the top dummy transistor TDT and the bottom dummy transistor BDT) in the planar NAND string. In other embodiments, a planar NAND string may include 8 memory cells, 16 memory cells, 32 memory cells, 64 memory cells, 128 memory cells, etc. However, the number of memory cells or dummy cells in a planar NAND string does not limit the scope of the present invention.

A typical architecture for a planar flash memory system using a NAND structure includes several planar NAND strings. Each planar NAND string is connected to the source line by its bottom select gate BSG controlled by the select line SGBL and connected to its associated bit line by its top select gate TSG controlled by the select line SGTL. Each bit line and the respective planar NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 3:
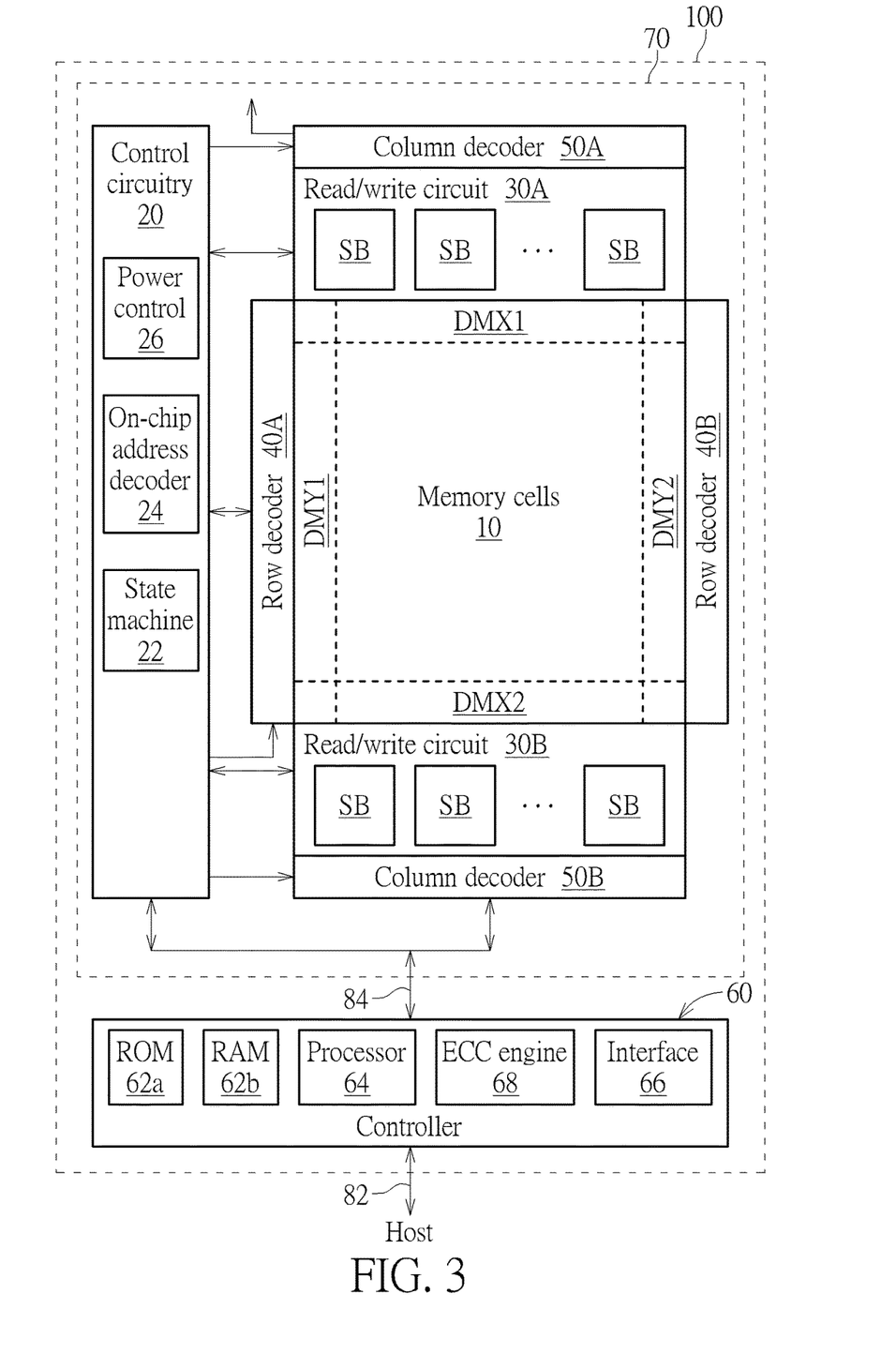
FIG. 3 is a diagram illustrating a 3D memory device having read/write circuits for reading and programming memory cells in parallel according to an embodiment of the present invention.

FIG. 3 is a diagram illustrating a planar memory device 100 having read/write circuits for reading and programming a page (or other unit) of memory cells in parallel according to an embodiment of the present invention. The planar memory device 100 includes an array (two-dimensional or three dimensional) of memory cells 10, a control circuitry 20, read/write circuits 30A and 30B, row decoders 40A and 40B, column decoders 50A and 50B, and a controller 60. In one embodiment, access to the memory array 10 by the various peripheral circuits is implemented in a symmetric fashion, on opposite sides of the array, so that the densities of access lines and circuitry on each side are reduced by half. The read/write circuits 30A and 30B include multiple sense blocks SB which allow a page of memory cells to be read or programmed in parallel. The array of memory cells 10 is addressable by word lines via the row decoders 40A and 40B and by bit lines via the column decoders 50A and 50B. In a typical embodiment, the memory cells 10, the control circuitry 20, the read/write circuits 30A and 30B, the row decoders 40A and 40B, and the column decoders 50A and 50B may be fabricated on a memory chip 70. Commands and data are transferred between a host and the controller 60 via a signal line 82 and between the controller 60 and the memory chip 70 via a signal line 84. A plurality of dummy cells, dummy word lines and dummy bit lines (not shown) may be laid in dummy storage areas DMX1-DMX2 and DMY1-DMY2 typically located along the sides of the memory array 10 for running read/write tests after the completion of the memory device 100.

The control circuitry 20 is configured to cooperate with the read/write circuits 30A and 30B for performing memory operations on the array of memory cells 10. The control circuitry 20 includes a state machine 22, an on-chip address decoder 24 and a power control module 26. The state machine 22 is configured to provide chip-level control of memory operations. The on-chip address decoder 24 is configured to provide an address interface between that used by the host or a memory controller to the hardware address used by the row decoders 40A, 40B and the column decoders 50A, 50B. The power control module 26 is configured to control the power and voltages supplied to the word lines and bit lines during each memory operation. The controller 60 may include storage devices such as ROM 62a and RAM 62b, a processor 64, a memory interface 66, and an error-correction code (ECC) engine 68. The ECC engine 68 can correct a number of read errors. The memory interface 66, in communication with the ROM 62a, RAM 62b and the processor 64, is an electrical circuit that provides an electrical interface between the controller 60 and memory cells 10. The storage device includes a code such as a set of instructions, and the processor 64 is operable to execute the set of instructions to provide the functionality of controlling and allocating memory, prioritizing the processing of instructions, and controlling input and output ports. The code can include instructions to perform the functions described herein including the steps discussed further below, and provide the voltage waveforms including those discussed further below. For example, the code can be used by the controller 60 to access the memory cells 10 such as for ramping, biasing, verification, preparation, programming, read and erase operations.

Figure 4:
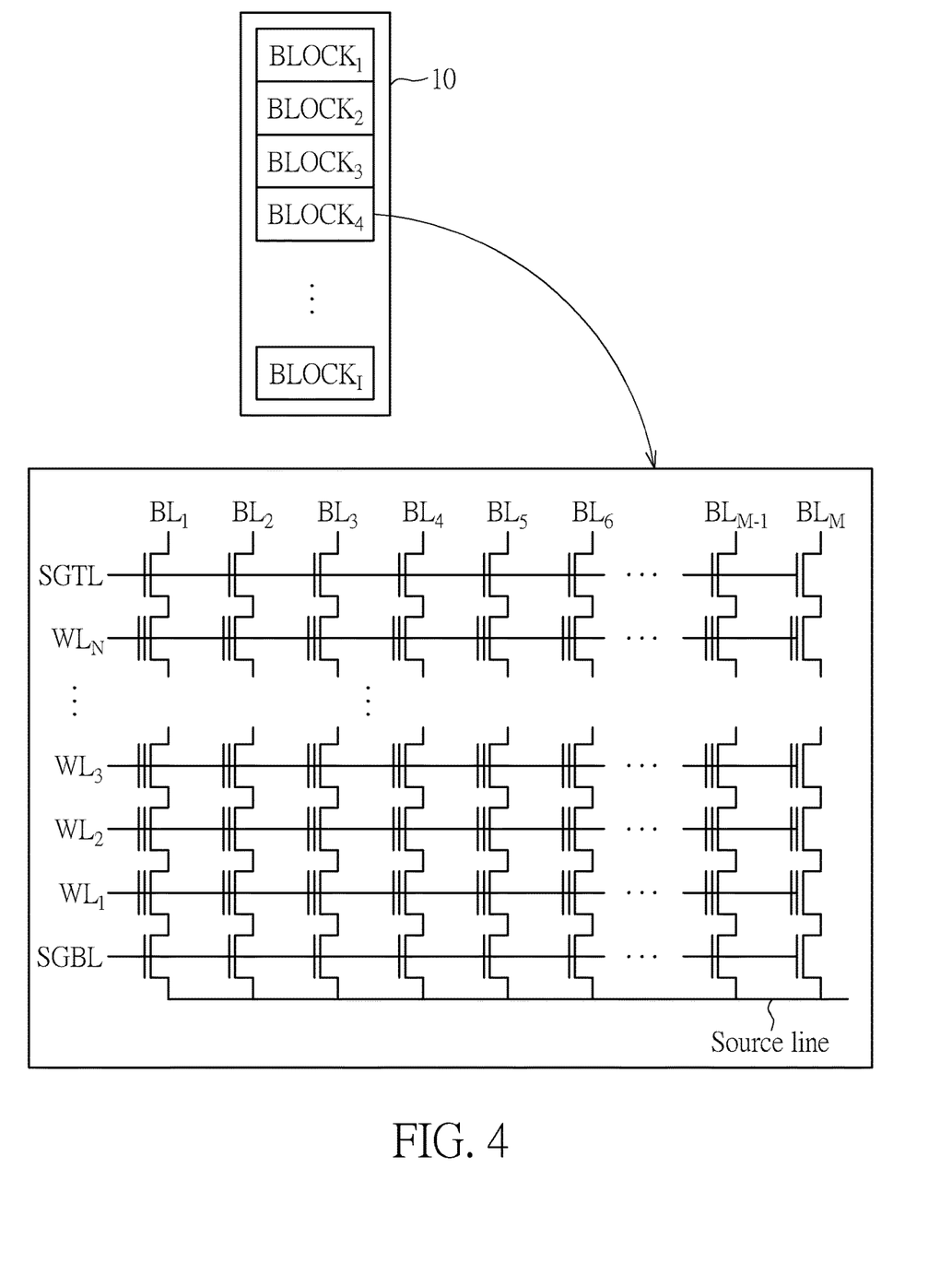
FIG. 4 is a diagram illustrating an exemplary structure of an array of memory cells in a planar configuration according to an embodiment of the present invention.

FIG. 4 is a diagram illustrating an exemplary structure of the array of memory cells 10 in a planar configuration according to an embodiment of the present invention. The array of memory cells 10 is divided into multiple blocks of memory cells denoted by $BLOCK_1 \sim BLOCK_I$, wherein I is a positive integer and typically equal to a large number. A block contains a set of NAND strings which are accessed via bit lines $BL_1$-$BL_M$ and a common set of word lines $WL_1 \sim WL_N$, wherein M and N are integers larger than 1. One terminal of the NAND string is connected to a corresponding bit line via the top select gate (controlled by the top select gate line TSGL), and another terminal is connected to the source line via the bottom select gate (controlled by the bottom select gate line BSGL). Each block is typically divided into a number of pages. In one embodiment, a block is the unit of conventional erase and a page is the unit of conventional programming. However, other units of erase/program can also be used.

In an embodiment, the array of memory cells 10 includes a triple well comprising a p-type substrate, an n-well within the p-type substrate, and a p-well within the n-well. The channel regions, source regions and drain regions are typically positioned in the p-well. The p-well and n-well are considered part of the p-type substrate, wherein the entire array of memory cells 10 is within one p-well, with trenches in the p-well providing electrical isolation between NAND strings. In another embodiment, the array of memory cells 10 includes a triple well comprising an n-type substrate, a p-well within the n-type substrate, and an n-well within the p-well. The p-well and n-well are considered part of the n-type substrate, wherein the channel regions, the source regions and the drain regions are typically positioned in the n-well. However, the implementation of the memory cells in a NAND string does not limit the scope of the present invention.

Figure 5:
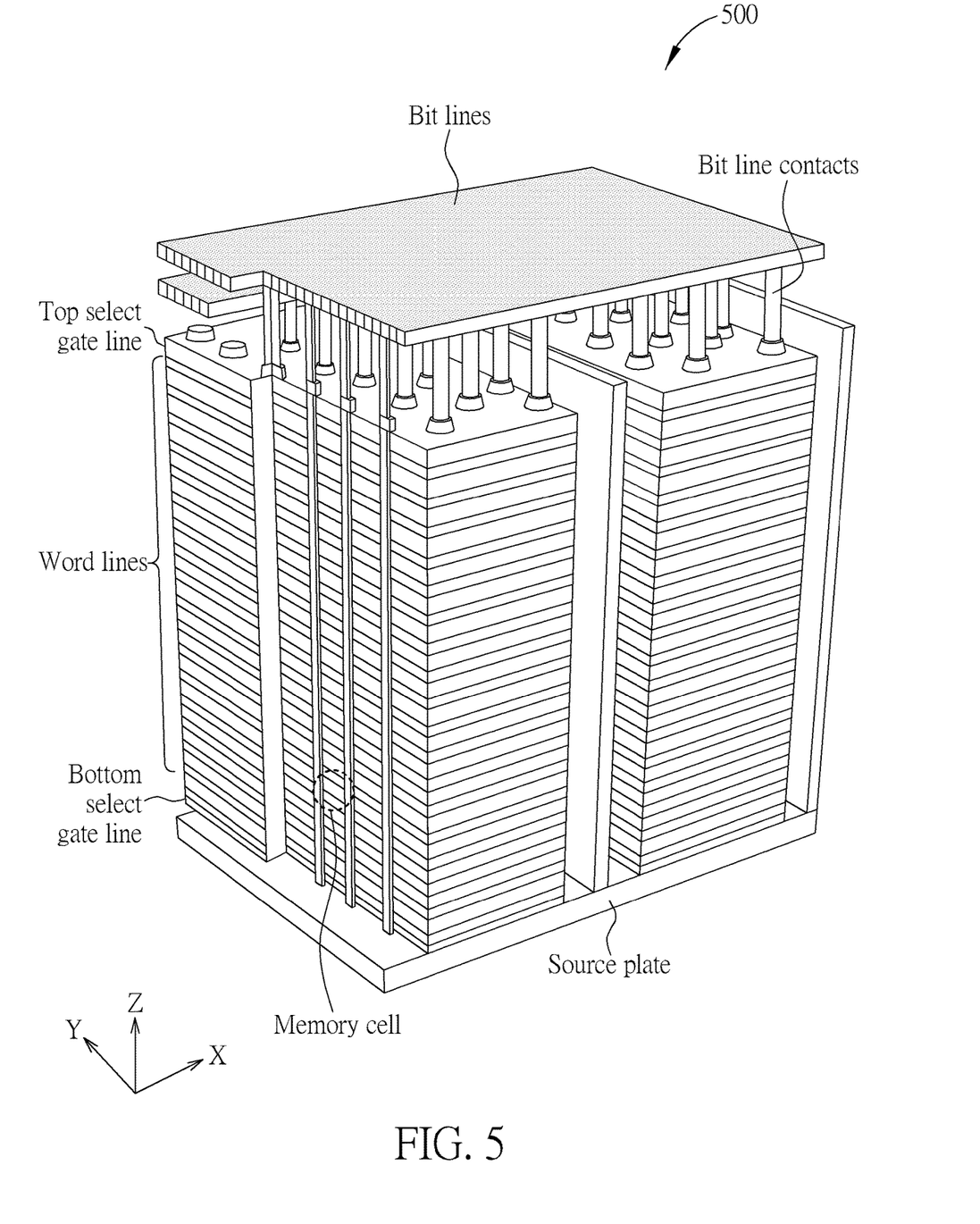
FIG. 5 is a diagram illustrating an exemplary structure of a channel-stacked memory device according to an embodiment of the present invention.

FIG. 5 is a diagram illustrating an exemplary structure of a channel-stacked memory device 500 according to an embodiment of the present invention. The channel-stacked memory device 500 can, loosely speaking, be formed by tilting up a plurality of the array of memory cells 10 in FIG. 4 to be perpendicular to the x-y plane. In this example, each y-z plane corresponds to the page structure of FIG. 4, with multiple such planes at differing locations along the x-axis. Each of the global bit lines runs across the top to an associated sense amplifier (not shown). The word lines, source plates and select gate lines run along the x-axis, with the NAND string connected at bottom to the common source plate.

Multiple NAND strings extend in a vertical direction, i.e. extending in the z-direction, perpendicular to the x-y plane of the substrate. Memory cells are formed where a vertical bit line passes through a word line. A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. The memory holes are then lined with a charge trapping layer and filled with a suitable local bit line/channel material (with suitable dielectric layers for isolation). Similar to planar NAND strings, a top select layer and a bottom select layer containing select gates are located at either end of the vertical NAND string to allow the vertical NAND string to be selectively connected to, or isolated from, external elements. Such external elements are generally conductive lines such as common source lines or bit lines that serve large numbers of NAND strings. Vertical NAND strings may be operated in a similar manner to planar NAND strings and either SLC/MLC/QLC operation is possible.

Figure 6:
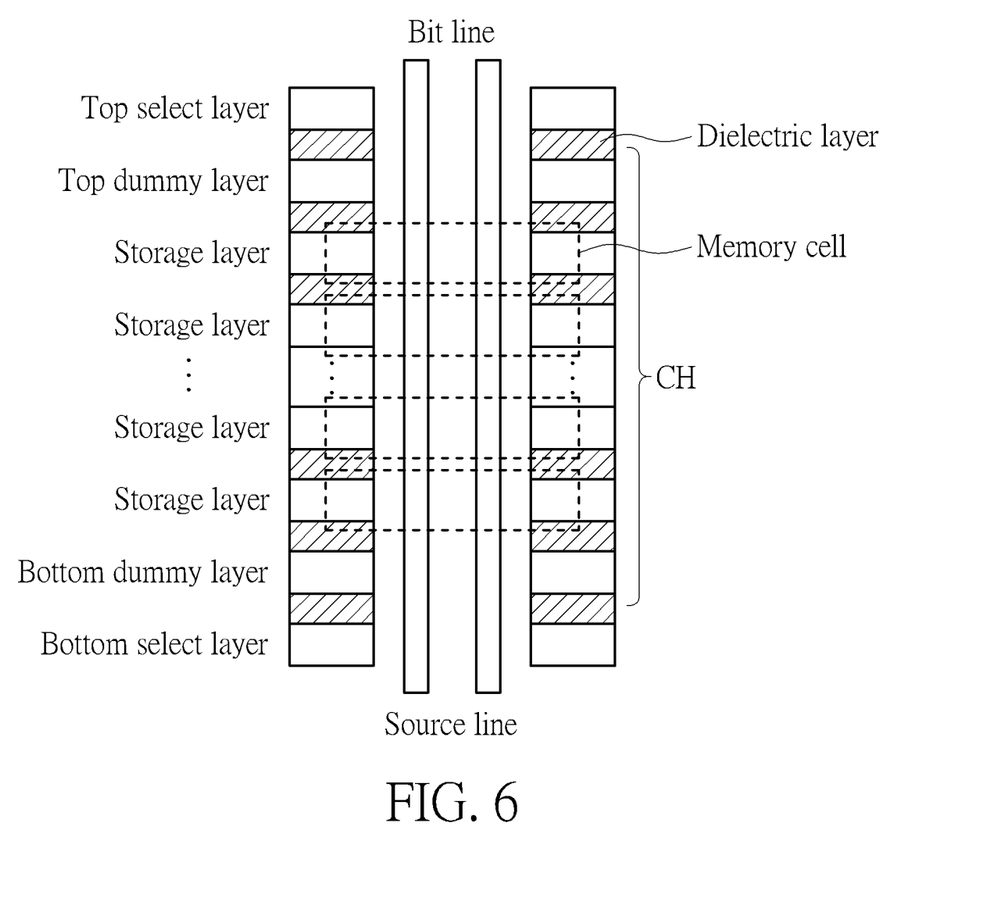
FIG. 6 is a representative diagram illustrating a cross-sectional view of a vertical NAND string in a single-channel-stacked memory device depicted in FIG. 5 according to an embodiment of the present invention.

FIG. 6 is a representative diagram illustrating a cross-sectional view of a vertical NAND string in a single-channel-stacked 3D memory device 500 according to an embodiment of the present invention. As previously stated, the vertical NAND string, when selected, can provide a channel CH associated with a bit line, a top dummy layer (the top dummy transistor), multiple storage layers (storage transistors controlled by respective word lines), and a bottom dummy layer (the bottom dummy transistor). The channel CH may be selectively coupled to a bit line via a top select layer (the top select gate) and to a source line via a bottom select layer (the bottom select gate BSG).

Figure 7:
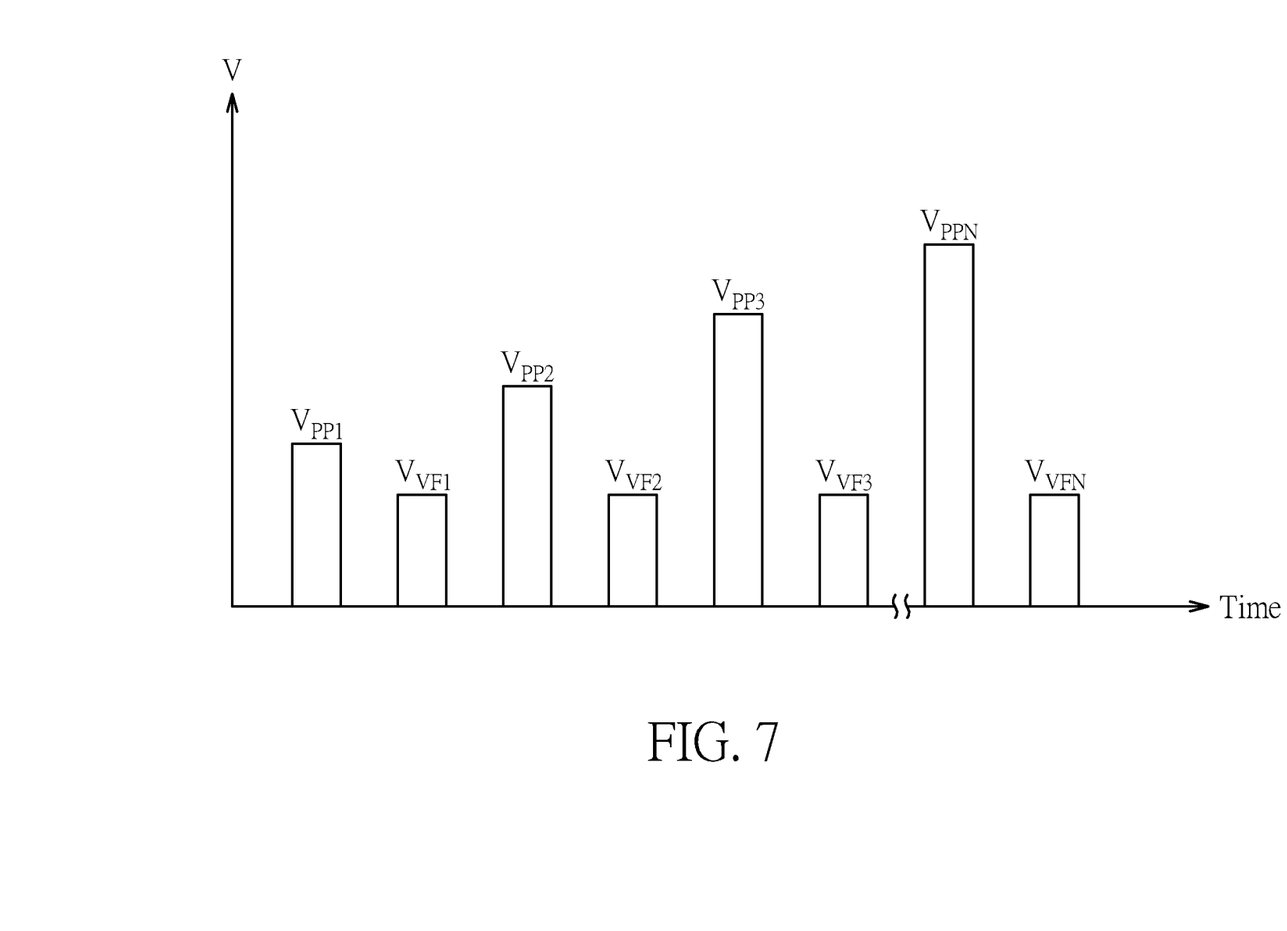
FIG. 7 is a diagram illustrating a cell programming process of a 3D memory device according to an embodiment of the present invention

FIG. 7 is a diagram illustrating a cell programming process of the 3D memory device 500 according to an embodiment of the present invention. The program operation is composed of several program pulse steps wherein the gate voltage of the program pulse is increased by a constant value after each program step, as shown by $V_{PP1} \sim V_{PPN}$ in FIG. 7. Meanwhile, verify pulses are applied between each program pulse for verifying the threshold voltage of each memory cell, as shown by $V_{VF1} \sim V_{VFN}$ in FIG. 7. The memory cells which pass the verification step will be inhibited in the subsequent program step, while the memory cells which fail the verification step will be programmed in the subsequent program step. The above-mentioned programming scheme is commonly known as incremental step pulse programming (ISPP).

Figure 8:
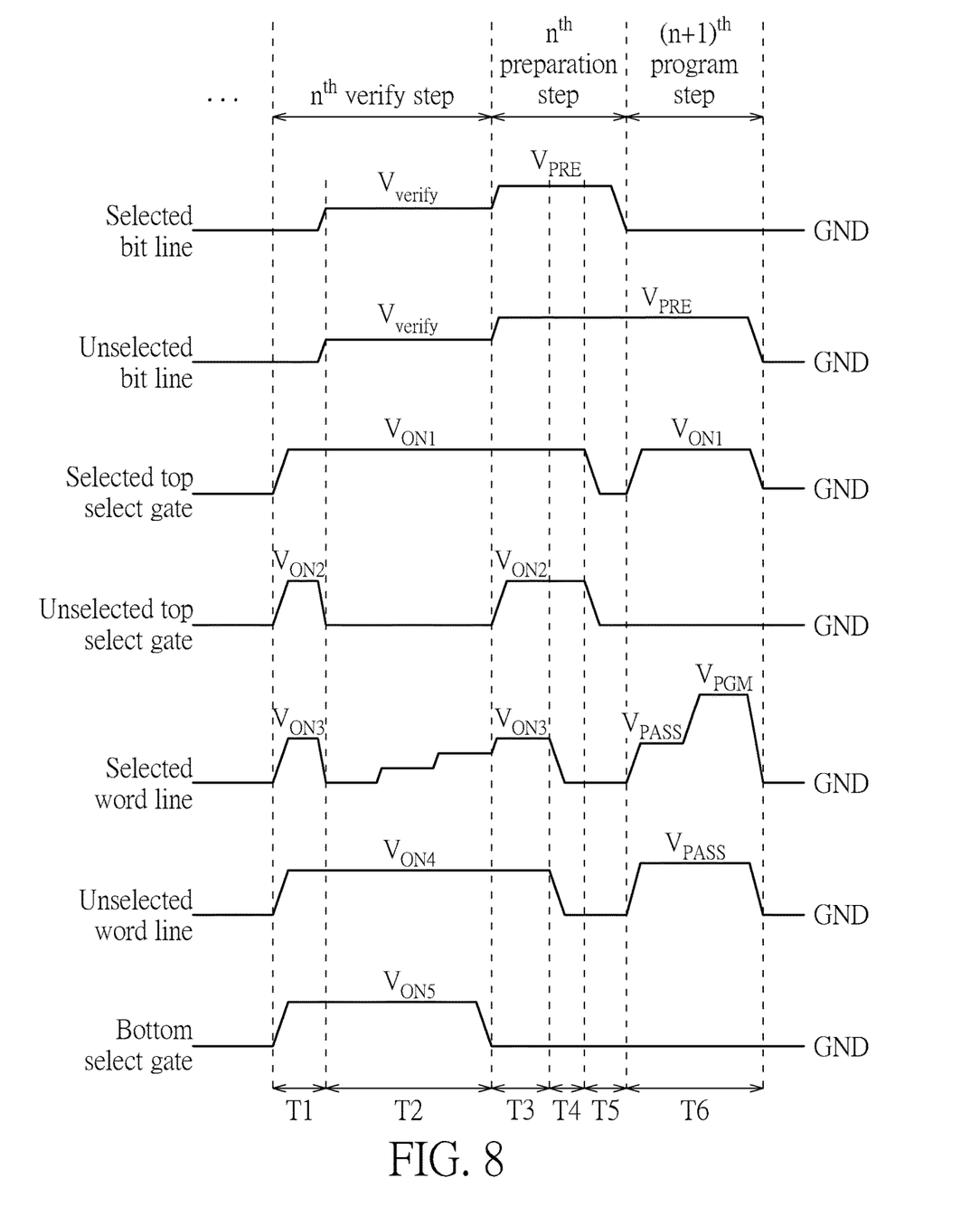
FIG. 8 is a diagram illustrating the levels of related signal lines when programming a vertical NAND string in a single-channel-stacked 3D memory device according to an embodiment of the present invention.

FIG. 8 is a diagram illustrating the levels of related signal lines when programming a vertical NAND string in the single-channel-stacked 3D memory device 500 according to an embodiment of the present invention. For illustrative purpose, a selected vertical NAND string and an unselected vertical NAND string in the channel-stacked memory device 500 are addressed. The selected vertical NAND string includes a plurality of storage layers (selected memory cells) controlled by a selected bit line among the plurality of bit lines $BL_1$-$BL_M$ and the common set of word lines $WL_1 \sim WL_N$. Among the plurality of memory cells of the selected NAND string, a storage layer to be programmed, referred to as a selected storage layer, is controlled by the selected bit line and a selected word line among the common set of word lines $WL_1 \sim WL_N$. Similarly, the unselected vertical NAND string includes a plurality of unselected storage layers (unselected memory cells) controlled by an unselected bit line among the plurality of bit lines $BL_1$-$BL_M$ and the common set of word lines $WL_1 \sim WL_N$. The top dummy layer of each vertical NAND string is laid in the dummy storage area DMX1 and the bottom dummy layer of each vertical NAND string is laid in the dummy storage area DMX2, as depicted in FIGS. 1 and 2.

As previously stated, the present cell programming process includes multiple program steps and multiple verification steps, wherein each program step is followed by a corresponding verification step. Meanwhile, a preparation step is also introduced immediately after each verification step and before the start of a corresponding verification step. For illustrative purpose, FIG. 8 only depicts the details of an $n^{th}$ verification step, an $n^{th}$ preparation step, and an $(n+1)^{th}$ program step wherein n is a positive integer, and T1~T6 represent different period during the $n^{th}$ verification step, the $n^{th}$ preparation step and the $(n+1)^{th}$ program step. Other verification steps, preparation steps and program steps may be executed in the same manner as depicted in FIG. 8.

The $n^{th}$ verification step includes a pre-charge period T1 and a read period T2 for verifying whether the memory cells have been successfully programmed in the previous $n^{th}$ program step. The $n^{th}$ preparation step includes period T3~T5 for reducing program disturb and increasing program speed. The $(n+1)^{th}$ program step includes a program period T6 for writing data into the memory cells.

During the pre-charge period T1 of the $n^{th}$ verification step depicted in FIG. 8, the selected bit line and the unselected bit line are biased to a ground level GND. The selected top select layer, the unselected top select layer and the bottom select layer are activated by raising the selected top select gate, the unselected top select gate and the bottom select gate to turn-on voltages $V_{ON1}$, $V_{ON2}$ and $V_{ON5}$ respectively. The selected word line and the unselected word line are activated when biased at turn-on voltages $V_{ON3}$ and $V_{ON4}$ respectively.

During the read period T2 of the $n^{th}$ verification step depicted in FIG. 8, the selected bit line and the unselected bit line are raised to a verify voltage $V_{verify}$. The selected top select gate and the bottom select gate are activated by respectively raising the selected top select gate and the bottom select gate to the turn-on voltages $V_{ON1}$ and $V_{ON5}$, while the unselected top select gate is deactivated when biased at the ground level GND. The unselected word line is activated when biased at the turn-on voltage $V_{ON4}$, while the selected word line is activated by gate pulses. Under such circumstance, data which has been programmed into the memory cells of the selected memory string during previously one or multiple program steps can be read out for verification.

During the period T3 of the $n^{th}$ preparation step depicted in FIG. 8, the selected bit line and the unselected bit line are raised from the verify voltage $V_{verify}$ to a pre-charge voltage $V_{PRE}$ with the selected top select gate and the unselected top select gate respectively activated by the turn-on voltages $V_{ON1}$ and $V_{ON2}$, thereby draining the electrons from the channel. The bottom select gate is deactivated when biased at the ground level GND, thereby isolating the bit line from the source line. The selected word line and the unselected word line are biased at the turn-on voltages $V_{ON3}$ and $V_{ON4}$, respectively.

At the start of the period T4 during the $n^{th}$ preparation step depicted in FIG. 8, the levels of the selected word line and the unselected word line gradually decrease to the ground level GND. Meanwhile, the selected top select gate remains activated when biased at the turn-on voltage $V_{ON1}$ during the period T4 of the $n^{th}$ preparation step, thereby allowing the electrons, which have been generated when the levels of the selected word line and the unselected word line are dropping, to be drained by the selected bit line.

During the period T5 of the $n^{th}$ preparation step depicted in FIG. 8, the selected top select gate and the unselected top select gate are deactivated when biased at the ground level GND.

During the period T6 of the $(n+1)^{th}$ program step depicted in FIG. 8, a selected memory cell may be programed by ramping the selected word line to a pass voltage $V_{PASS}$ and then to a program voltage $V_{PGM}$, biasing the unselected word line at the pass voltage $V_{PASS}$, biasing the selected bit line at the ground level GND, biasing the unselected bit line at the pre-charge voltage $V_{PRE}$, biasing the selected top select gate at the turn-on voltage $V_{ON1}$, and biasing the unselected top select gate and the bottom select gate at the ground level GND.

Figure 9:
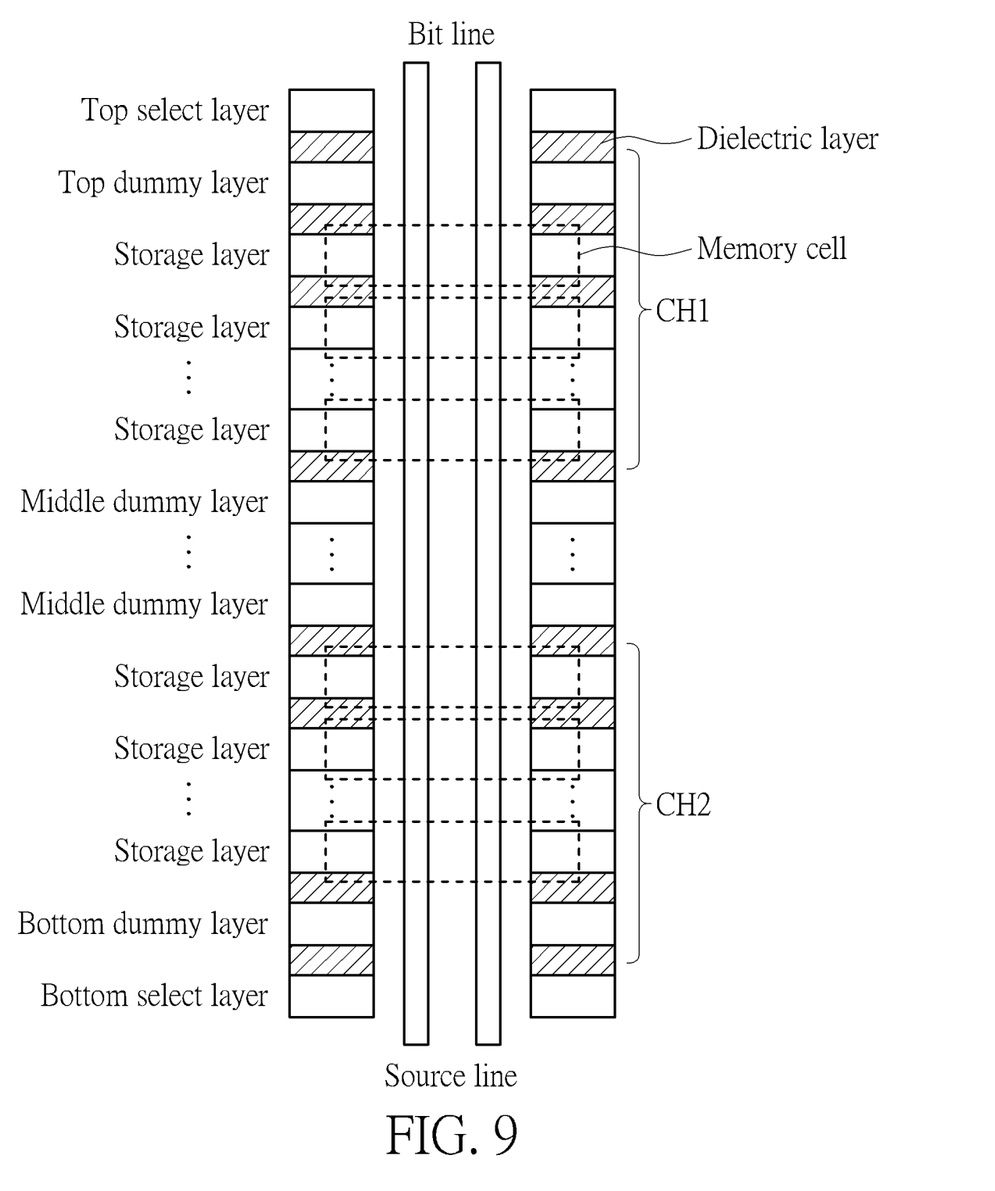
FIG. 9 is a representative diagram illustrating a cross-sectional view of a vertical NAND string in a two-channel-stacked memory device depicted in FIG. 5 according to an embodiment of the present invention.

FIG. 9 is a representative diagram illustrating a cross-sectional view of a vertical NAND string in a two-channel-stacked 3D memory device 500 according to an embodiment of the present invention. As previously stated, each vertical NAND string may be formed by stacking a plurality of planar NAND strings depicted in FIG. 1. For illustrative purpose, the vertical NAND string depicted in FIG. 9 is formed by stacking two planar NAND strings depicted in FIG. 1, which, when selected, can provide a first channel CH1 and a second channel CH2. The first channel CH1 is associated with a selected bit line, a top dummy layer (the top dummy transistor) and multiple storage layers (storage transistors controlled by word lines), while the second channel CH2 is associated with the selected bit line, multiple storage layers and a bottom dummy layer (the bottom dummy transistor). One or multiple middle dummy layers are disposed between the first channel CH1 and the second channel CH2. The first channel CH1 and the second channel are coupled in series and sandwiched between a top select layer (the top select gate) and a bottom select layer (the bottom select gate).

Figure 10:
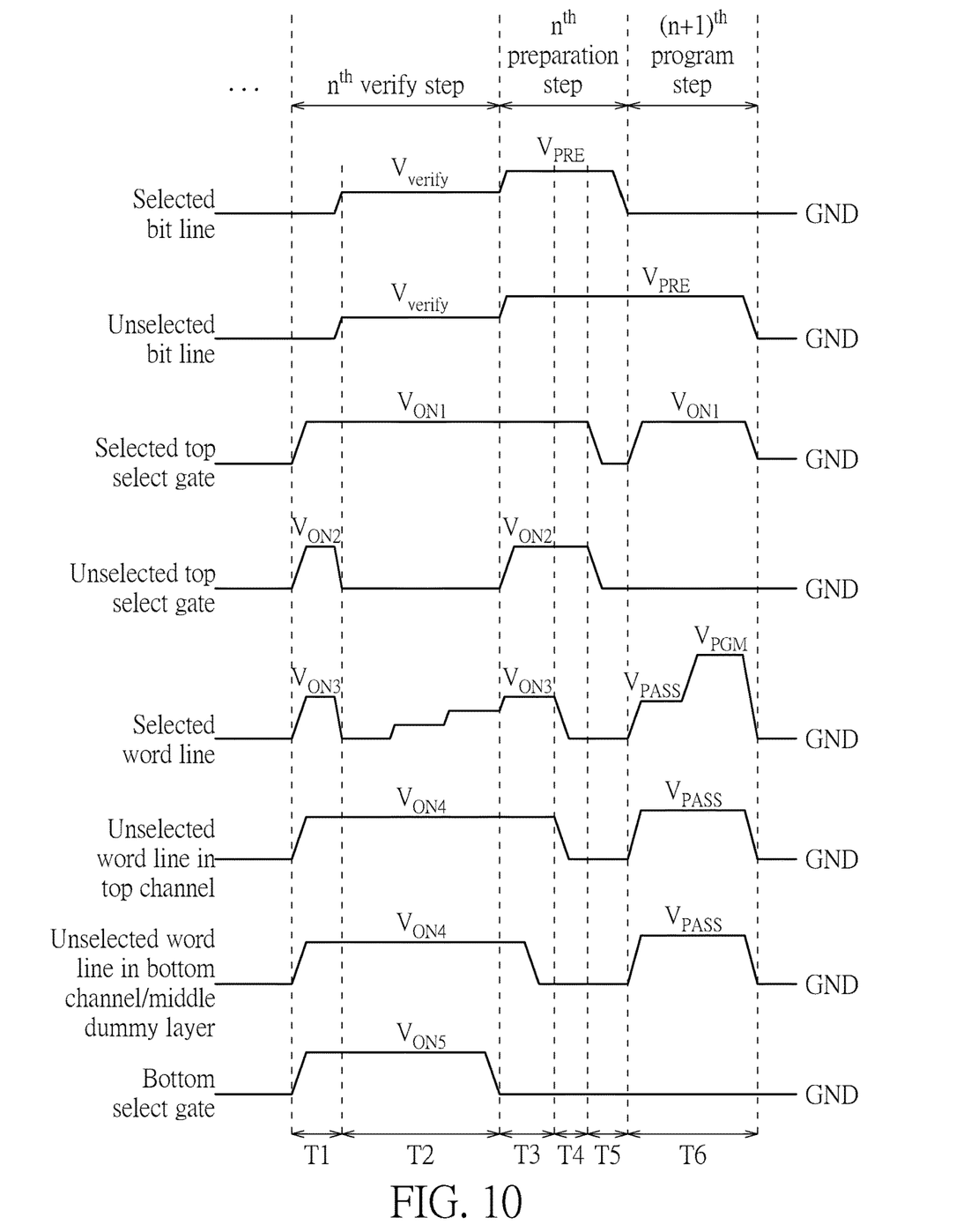
FIG. 10 is a diagram illustrating the levels of related signal lines when programming a vertical NAND string in a two-channel-stacked 3D memory device according to an embodiment of the present invention.

FIG. 10 is a diagram illustrating the levels of related signal lines when programming a vertical NAND string in the two-channel-stacked 3D memory device 500 according to an embodiment of the present invention. As previously stated, the present cell programming process includes multiple program steps and multiple verification steps, wherein each program step is followed by a corresponding verification step. Meanwhile, a preparation step is also introduced immediately after each verification step and before the start of a corresponding verification step. For illustrative purpose, FIG. 10 only depicts an $n^{th}$ verification step, an $n^{th}$ preparation step, and an $(n+1)^{th}$ program step wherein n is an n is a positive integer, and T1~T6 represent different period during the $n^{th}$ verification step, the $n^{th}$ preparation step and the $(n+1)^{th}$ program step. Other verification steps, preparation steps and program steps may be executed in the same manner as depicted in FIG. 10.

During the pre-charge period T1 of the $n^{th}$ verification step depicted in FIG. 10, the selected bit line and the unselected bit line are biased to a ground level GND. The selected top select layer, the unselected top select layer and the bottom select layer are activated by raising the selected top select gate, the unselected top select gate and the bottom select gate to turn-on voltages $V_{ON1}$, $V_{ON2}$ and $V_{ON5}$ respectively. The selected word line is activated when biased at a turn-on voltage $V_{ON3}$, the unselected word line associated with the top channel CH1 or the bottom channel CH2 is activated when biased at a turn-on voltage $V_{ON4}$ and the middle dummy layer is biased at the turn-on voltage $V_{ON4}$.

During the read period T2 of the $n^{th}$ verification step depicted in FIG. 10, the selected bit line and the unselected bit line are raised to a verify voltage $V_{verify}$. The selected top select gate and the bottom select gate are activated by respectively raising the selected top select gate and the bottom select gate to the turn-on voltages $V_{ON1}$ and $V_{ON5}$ while the unselected top select gate is deactivated when biased at the ground level GND. The unselected word line associated with the top channel CH1 or the bottom channel CH2 is activated when biased at the turn-on voltage $V_{ON4}$, while the selected word line is activated by gate pulses. Under such circumstance, data which has been programmed into the memory cells of the selected memory string during previously one or multiple program steps can be read out for verification.

During the period T3 of the $n^{th}$ preparation step depicted in FIG. 10, the selected bit line and the unselected bit line are raised from the verify voltage $V_{verify}$ to a pre-charge voltage $V_{PRE}$ with the selected top select gate and the unselected top select gate respectively activated by the turn-on voltages $V_{ON1}$ and $V_{ON2}$, thereby draining the electrons from the channel. The bottom select gate is deactivated when biased at the ground level GND, thereby isolating the bit line from the source line. The selected word line is biased at the turn-on voltage $V_{ON3}$. The levels of the unselected word line associated with the bottom channel CH2 and the middle dummy layer gradually decrease from the turn-on voltage $V_{ON4}$ to the ground level GND, while the unselected word line associated with the top channel CH1 remains activated when biased at the turn-on voltage $V_{ON4}$. Therefore, the electrons accumulated in the middle storage layer may be drained by the selected bit line.

At the start of the period T4 during the $n^{th}$ preparation step depicted in FIG. 10, the levels of the selected word line and the unselected word line associated with the top channel CH1 gradually decrease to the ground level GND, and the unselected word line associated with the bottom channel CH2 and the middle dummy layer are still biased at the ground level GND. Meanwhile, the selected top select gate remains activated when biased at the turn-on voltage $V_{ON1}$ during the period T4 of the $n^{th}$ preparation step, thereby allowing the electrons, which have been generated when the levels of the selected word line and the unselected word line associated with the top channel CH1 are dropping, to be drained by the selected bit line.

During the period T5 of the $n^{th}$ preparation step depicted in FIG. 10, the selected top select gate and the unselected top select gate are deactivated when biased at the ground level During the period T6 of the $(n+1)^{th}$ program step depicted in FIG. 10, a selected memory cell may be programmed by ramping the selected word line to a pass voltage $V_{PASS}$ and then to a program voltage $V_{PGM}$, biasing the unselected word line at the pass voltage $V_{PASS}$, biasing the selected bit line at the ground level GND, biasing the unselected bit line at the pre-charge voltage $V_{PRE}$, biasing the selected top select gate at the turn-on voltage $V_{ON1}$, and biasing the unselected top select gate and the bottom select gate at the ground level GND.

In one embodiment, one or any combination of the control circuitry 20, the read/write circuits 30A and 30B, the row decoders 40A and 40B, the column decoders 50A and 50B, and/or the controller 60 depicted in FIG. 3 may be referred to as a control unit capable of performing the processes of programming as depicted in FIGS. 7, 8 and 10.

In the present invention, a vertical NAND string in a channel-stacked 3D memory device may be programmed using ISPP scheme, wherein a preparation step is introduced immediately after each verification step and before the start of a corresponding verification step. During the preparation step, the electrons accumulated in the channel may be drained by the selected bit line for enhancing the coupling effect of the channel, thereby reducing program disturb and increasing program speed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of programming a memory device which includes a plurality of memory cells, a plurality of word lines, a plurality of bit lines, a plurality of top select gates and a bottom select gate, the method comprising:
    performing a first program step on the plurality of memory cells;
    performing a first verify step on the plurality of memory cells after performing the first program step;
    performing a preparation step on the plurality of memory cells after performing the first verify step by:
        deactivating the bottom select gate;
        ramping a selected bit line and an unselected bit line among the plurality of bit lines to a pre-charge voltage;

deactivating a selected word line and an unselected word line among the plurality of word lines at a first time point during the preparation step;
deactivating a selected top select gate and an unselected top select gate among the plurality of top select gates at a second time point during the preparation step, wherein the second time point occurs later than the first time point;
biasing the selected bit line and the unselected bit line at the pre-charge voltage during the preparation step;
biasing the selected top select gate at a first turn-on voltage during a first period of the preparation step and a second period of the preparation step subsequent to the first period;
biasing the unselected top select gate at a second turn-on voltage during the first period and the second period;
biasing the selected top select gate and the unselected top select gate at a ground voltage during a third period of the preparation step subsequent to the second period;
biasing the selected word at a third turn-on voltage during the first period;
biasing the unselected word at a fourth turn-on voltage during the first period;
biasing the selected word line and the unselected word at the ground voltage during the second period and the third period; and
biasing the bottom select gate at the ground voltage during the preparation step; and
performing a second program step on one or multiple memory cells among the plurality of memory cells which fail the first verify step after performing the preparation step.

2. The method of claim 1, wherein performing the first verify step on the plurality of memory cells comprises:
deactivating the selected bit line and the unselected bit line during a pre-charge period of the first verify step;
activating the selected top select gate, the unselected top select gate, the selected word line, the unselected word line and the bottom select gate during the pre-charge period of the first verify step;
biasing the selected bit line and the unselected bit line at a verify voltage during a read period of the first program step subsequent to the pre-charge period;
activating the selected top select gate, the selected word line, the unselected word line, and the bottom select gate during the read period of the first verify step; and
deactivating the unselected top select gate during the read period of the first verify step.

3. The method of claim 1, wherein performing the first program step on the plurality of memory cells comprises:
ramping the selected word line to a pass voltage and then to a program voltage;
biasing the unselected word line at the pass voltage;
biasing the unselected bit line at the pre-charge voltage;
activating the selected top select gate; and
deactivating the selected bit line, the unselected top select gate and the bottom select gate.

4. A method of programming a memory device which includes a first channel associated with a bottom select gate, a selected bit line and a first group of word lines, a second channel stacked on the first channel and associated with a selected top select gate, the selected bit line and a second group of word lines, and a middle dummy layer disposed between the first channel and the second channel, the method comprising:

performing a first program step on the first channel and the second channel;
performing a first verify step on the first channel and the second channel after performing the first program step;
performing a preparation step on the first channel and the second channel after performing the first verify step by:
deactivating the bottom select gate;
ramping a selected bit line and an unselected bit line among the plurality of bit lines to a pre-charge voltage;
deactivating the middle dummy layer and an unselected word line in the first group of word lines at a first time point during the preparation step;
deactivating an unselected word line in the second group of word lines at a second time point during the preparation step, wherein the second time occurs later than the first time point;
deactivating a selected word line in the first group of word lines or in the second group of word lines at the second time point;
deactivating the selected top select gate at a third time point during the preparation step, wherein the third time occurs later than the second time point;
biasing the selected bit line and the unselected bit line at the pre-charge voltage during the preparation step;
biasing the selected top select gate at a first turn-on voltage during a first period of the preparation step and a second period of the preparation step subsequent to the first period;
biasing the unselected top select gate at a second turn-on voltage during the first period and the second period;
biasing the selected top select gate and the unselected top select gate at a ground voltage during a third period of the preparation step subsequent to the second period;
biasing the selected word in the first group of word lines or in the second group of word lines at a third turn-on voltage during the first period;
biasing the unselected word in the second group of word lines at a fourth turn-on voltage during the first period;
biasing the selected word in the first group of word lines or in the second group of word lines and the unselected word in the second group of word lines at the ground voltage during the second period and the third period;
reducing a level of the unselected word in the first group of word lines from the fourth turn-on voltage to the ground level during the first period;
biasing the unselected word in the first group of word lines at the ground voltage during the second period and the third period; and
biasing the bottom select gate at the ground voltage during the preparation step; and
performing a second program step on one or multiple memory cells in the first channel or the second channel which fail the first verify step after performing the preparation step.

5. The method of claim 4, wherein performing the first verify step on the first channel and the second channel comprises:
deactivating the selected bit line and the unselected bit line during a pre-charge period of the first verify step;
activating the selected top select gate, an unselected top select gate, the selected word line in the first group of word lines or in the second group of word lines, the unselected word line in the first group of word lines and in the second group of word lines, and the bottom select gate during the pre-charge period of the first verify step;

biasing the selected bit line and the unselected bit line at a verify voltage during a read period of the first program step subsequent to the pre-charge period;

activating the selected top select gate, the selected word line in the first group of word lines or in the second group of word lines, the unselected word line in the first group of word lines or in the second group of word lines, and the bottom select gate during the read period of the first verify step; and deactivating the unselected top select gate during the read period of the first verify step.

6. The method of claim 4, wherein performing the first program step on the plurality of memory cells comprises:

ramping the selected word line in the first group of word lines or in the second group of word lines to a pass voltage and then to a program voltage;

biasing the unselected word line in the first group of word lines or in the second group of word lines at the pass voltage;

biasing the unselected bit line at the pre-charge voltage;

activating the selected top select gate; and deactivating the selected bit line, the unselected top select gate and the bottom select gate.

7. A memory device, comprising:
a plurality of memory cells;
a plurality of word lines;
a plurality of bit lines;
a plurality of top select gates;
a bottom select gate; and
a control unit configured to:
  perform a first program step on the plurality of memory cells by:
    ramping a selected word line among the plurality of word lines to a pass voltage and then to a program voltage;
    biasing an unselected word line among the plurality of word lines at the pass voltage;
    biasing an unselected bit line among the plurality of bits lines at the pre-charge voltage;
    activating a selected top select gate among the plurality of top select gates; and
    deactivating a selected bit line among the plurality of bits lines, an unselected top select gate among the plurality of top select gates and the bottom select gate;
  perform a first verify step on the plurality of memory cells after performing the first program step by:
    deactivating the selected bit line and the unselected bit line during a pre-charge period of the first verify step;
    activating the selected top select gate, the unselected top select layer, the selected word line, the unselected word line and the bottom select gate during the pre-charge period of the first verify step;
    biasing the selected bit line and the unselected bit line at a verify voltage during a read period of the first program step subsequent to the pre-charge period;
    activating the selected top select gate, the selected word line, the unselected word line, and the bottom select gate during the read period of the first verify step; and
    deactivating the unselected top select gate during the read period of the first verify step;
  perform a preparation step on the plurality of memory cells after performing the first verify step by:
    deactivating the bottom select gate;
    ramping the selected bit line and the unselected bit line to a pre-charge voltage;
    deactivating the selected word line and the unselected word line-at a first time point during the preparation step; and
    deactivating the selected top select gate and the unselected top select gate at a second time point during the preparation step, wherein the second time point occurs later than the first time point; and
  perform a second program step on one or multiple memory cells among the plurality of memory cells which fail the first verify step after performing the preparation step.

8. The memory device of claim 7, wherein the control unit is further configured to perform the preparation step on the plurality of memory cells by:

biasing the selected bit line and the unselected bit line at the pre-charge voltage during the preparation step;

biasing the selected top select gate at a first turn-on voltage during a first period of the preparation step and a second period of the preparation step subsequent to the first period;

biasing the unselected top select gate at a second turn-on voltage during the first period and the second period;

biasing the selected top select gate and the unselected top select gate at a ground voltage during a third period of the preparation step subsequent to the second period;

biasing the selected word at a third turn-on voltage during the first period;

biasing the unselected word at a fourth turn-on voltage during the first period;

biasing the selected word line and the unselected word at the ground voltage during the second period and the third period; and biasing the bottom select gate at the ground voltage during the preparation step.

9. A memory device, comprising:
a first channel associated with a bottom select gate, a selected bit line and a first group of word lines;
a second channel stacked on the first channel and associated with a selected top select gate, the selected bit line and a second group of word lines;
a middle dummy layer disposed between the first channel and the second channel; and
a control unit configured to:
  perform a first program step on the first channel and the second channel by:
    ramping a selected word line in the first group of word lines or in the second group of word lines to a pass voltage and then to a program voltage;
    biasing an unselected word line in the first group of word lines or in the second group of word lines at the pass voltage;
    biasing an unselected bit line among the plurality of bit lines at the pre-charge voltage;
    activating the selected top select gate; and
    deactivating the selected bit line, the unselected top select gate and the bottom select gate;
  perform a first verify step on the first channel and the second channel after performing the first program step by:

deactivating the selected bit line and the unselected bit line during a pre-charge period of the first verify step;

activating the selected top select gate, an unselected top select gate, the selected word line in the first group of word lines or in the second group of word lines, the unselected word line in the first group of word lines and in the second group of word lines, and the bottom select gate during the pre-charge period of the first verify step;

biasing the selected bit line and the unselected bit line at a verify voltage during a read period of the first program step subsequent to the pre-charge period;

activating the selected top select gate, the selected word line in the first group of word lines or in the second group of word lines, the unselected word line in the first group of word lines or in the second group of word lines, and the bottom select gate during the read period of the first verify step; and deactivating the unselected top select gate during the read period of the first verify step;

perform a preparation step on the first channel and the second channel after performing the first verify step by:

deactivating the bottom select gate;

ramping the selected bit line and the unselected bit line to a pre-charge voltage;

deactivating the middle dummy layer and the unselected word line in the first group of word lines at a first time point during the preparation step;

deactivating the unselected word line in the second group of word lines at a second time point during the preparation step, wherein the second time occurs later than the first time point;

deactivating the selected word line in the first group of word lines or in the second group of word lines at the second time point; and deactivating the selected top select gate at a third time point during the preparation step, wherein the third time occurs later than the second time point; and perform a second program step on one or multiple memory cells in the first channel or the second channel which fail the first verify step after performing the preparation step.

10. The memory device of claim 9, wherein the control unit is further configured to perform the preparation step on the first channel and the second channel by:

biasing the selected bit line and the unselected bit line at the pre-charge voltage during the preparation step;

biasing the selected top select gate at a first turn-on voltage during a first period of the preparation step and a second period of the preparation step subsequent to the first period;

biasing the unselected top select gate at a second turn-on voltage during the first period and the second period;

biasing the selected top select gate and the unselected top select gate at a ground voltage during a third period of the preparation step subsequent to the second period;

biasing the selected word in the first group of word lines or in the second group of word lines at a third turn-on voltage during the first period;

biasing the unselected word in the second group of word lines at a fourth turn-on voltage during the first period;

biasing the selected word in the first group of word lines or in the second group of word lines and the unselected word in the second group of word lines at the ground voltage during the second period and the third period;

reducing a level of the unselected word in the first group of word lines from the fourth turn-on voltage to the ground level during the first period;

biasing the unselected word in the first group of word lines at the ground voltage during the second period and the third period; and biasing the bottom select gate at the ground voltage during the preparation step.

* * * * *